(12) United States Patent
Kimura et al.

(10) Patent No.: US 7,694,649 B2
(45) Date of Patent: Apr. 13, 2010

(54) SUBSTRATE PROCESSING SYSTEM AND METHOD OF CONTROLLING THE SAME

(75) Inventors: Yoshio Kimura, Koshi (JP); Takahiro Okubo, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 746 days.

(21) Appl. No.: 11/472,358

(22) Filed: Jun. 22, 2006

(65) Prior Publication Data

US 2007/0095278 A1 May 3, 2007

(30) Foreign Application Priority Data

Jun. 24, 2005 (JP) ............................ 2005-184296

(51) Int. Cl.
*B05C 11/00* (2006.01)
*B05C 13/02* (2006.01)
*B05B 7/06* (2006.01)
*B05B 17/00* (2006.01)

(52) U.S. Cl. ...................... 118/684; 118/683; 118/313; 118/326; 118/697; 239/71; 239/69

(58) Field of Classification Search .................. 118/52, 118/612, 319, 320, 682–684, 50, 634, 326, 118/313–315, 679, 695–698; 396/604, 611, 396/627; 134/153, 198, 902; 427/240; 239/71, 239/119; 222/71
See application file for complete search history.

(56) References Cited

U.S. PATENT DOCUMENTS

| 6,391,111 | B1 | 5/2002 | Fujimoto et al. | |
| 6,530,340 | B2 * | 3/2003 | You et al. | 118/696 |
| 6,848,625 | B2 * | 2/2005 | Takekuma et al. | 239/1 |
| 2004/0094087 | A1 * | 5/2004 | Ivanov et al. | 118/300 |

FOREIGN PATENT DOCUMENTS

JP 2000-235949 8/2000

* cited by examiner

*Primary Examiner*—Yewebdar T Tadesse
(74) *Attorney, Agent, or Firm*—Oblon, Spivak, McClelland, Maier & Neustadt, L.L.P.

(57) ABSTRACT

A process system includes a plurality of processing modules each processing a substrate with a process liquid. There is disposed a dispensing mechanism that dispenses the process liquid to the vertically arranged modules. The dispensing mechanism is provided with a process liquid supply source, and pumps corresponding to the respective processing modules. Each pump temporarily stores therein the process liquid which has been pressure-fed through a riser piping from the process liquid supply source by a pressing apparatus, and delivers the process liquid from an outlet. There are disposed nozzles each having a discharge port and discharging the process liquid to the corresponding processing module. Delivery pipings connecting the outlets of the pumps with the discharge ports of the corresponding nozzles have identical length to each other.

15 Claims, 7 Drawing Sheets

| STEP | SECTION | VALVE V2 | VALVE V3 | VALVE V6 | PRESSURE-FEED BY PUMP | AMC |
|---|---|---|---|---|---|---|
| TO SUPPLY LIQUID INTO PUMP | S1: STARTING PRESSURIZ-ING OF PUMP | On | Off | Off | Off | Off |
| | S2: STABILIZING PRESSUR | On | On | Off | Off | Off |
| | S3: FILLING PUMP WITH LIQUID | On | On | On | Off | Off |
| | S4: ACCUMULATING PRESSURE IN PUMP | On | On | Off | Off | Off |
| | S5: MAINTAINING ACCUMU-LATED PRESSURE | On | Off | Off | Off | Off |
| | S6: STOPPING PRESSURIZ-ING OF PUMP | Off | Off | Off | Off | Off |
| TO DISCHARGE LIQUID FROM NOZZLE | S7: STARTING DISCHARGE OF LIQUID | Off | Off | Off | On | On |
| | S8: STOPPING DISCHARGE OF LIQUID | Off | Off | Off | Off | Off |

PROCESS ORDER (TIME SERIES) →

FIG. 7

SUBSTRATE PROCESSING SYSTEM AND METHOD OF CONTROLLING THE SAME

BACKGROUND OF THE INVENTION

1. Field of the Invention

The present invention relates to a substrate processing system configured to dispense a process liquid to a plurality of vertically arranged processing modules each processing a substrate with the process liquid. The present invention also relates to a method of controlling such a substrate processing system.

2. Description of Related Art

In a photo-lithographing step performed when manufacturing electronic devices such as semiconductors, an in-line process is conducted by using, in combination, a resist applying and developing apparatus, which is a unit apparatus for applying a resist liquid (hereinafter referred to as "resist") to a substrate such as a wafer and developing the same, and an aligner, which exposes the substrate to which the resist has been applied. By subjecting a substrate to a series of processes, such as a cleaning process, dewatering and baking process, adhesion (hydrophobizing) process, resist applying process, pre-baking process, exposure process, baking process before developing process, developing process, and post-baking process, in this order, a predetermined circuit pattern is formed in a resist layer on the substrate. JP2000-235949A describes such an in-line process at the photolithographing step.

With a view to improving a production efficiency, the resist applying and developing apparatus includes a plurality of processing modules having the same processing function so as to simultaneously process a plurality of wafers. When all of these processing modules are horizontally arranged, the apparatus occupies an increased footprint. Thus, there is a tendency to vertically arrange the plurality of processing modules. As a result, a height of the overall apparatus recently reaches as high as about 3 meters.

The increased height of the overall apparatus by the vertically arranged processing modules produces an adverse effect on conditions of a resist (process liquid) discharged from nozzles (discharge pressure, discharge flow amount, discharge period, and so on) in a dispensing mechanism for dispensing the resist to the processing modules.

That is, in the conventional dispensing mechanism, pumps for supplying the resist to the nozzles and a bottle for containing the resist, or the like, are disposed near a bottom of the resist applying and developing apparatus, in order for facilitating a maintenance operation. However, this structure is disadvantageous in that, since pipings connecting outlets of the pumps with discharge ports of the nozzles vary in length in accordance with the corresponding processing modules, the resist is discharged from the nozzles to the respective processing modules at different pressures (the higher a position of the processing module is, the lower the discharge pressure becomes).

Although the same resist applying process is intended to be performed by the plurality of processing modules, the different resist discharge conditions of the respective modules may result in non-uniform film-thickness profiles of the applied resist. In order to cope with this situation, it is possible to set, with respect to each module, control parameters of the pump, and process conditions such as opening and closing timings of dispensing valve disposed upstream of the nozzle. However, if a defective film thickness profile of the resist is found after completion of the process, it takes a long time to search for a cause of such a trouble or manage the same, because all the parameters and conditions have to be verified.

In the conventional dispensing mechanism, a pump adapted to temporarily store a resist (process liquid) and deliver the same draws in and stores the liquid by its suction motion. Thus, the pressure in a piping on a pump suction side is reduced to a negative pressure. In this case, there is a possibility that a gas (e.g., nitrogen) dissolved in the resist forms micro bubbles because of the negative pressure. When the liquid includes the bubbles, the liquid may be undesirably, non-uniformly applied to a wafer.

SUMMARY OF THE INVENTION

The present invention has been made in view of the above circumstances. The main object of the present invention is to provide a substrate processing system configured to dispense a process liquid to a plurality of vertically arranged processing modules each processing a substrate with the process liquid, in which discharge conditions of the process liquid can be made uniform for each of the processing modules.

In order to achieve this object, the present invention provides: a substrate processing system comprising: a plurality of vertically arranged processing modules each processing a substrate with a process liquid; and a dispensing mechanism that dispenses the process liquid to the processing modules; wherein the dispensing mechanism includes: a process liquid supply source that contains the process liquid; a pressing apparatus that pressurizes the process liquid supply source to pressure-feed the process liquid; a plurality of pumps corresponding to the respective processing modules, each temporarily storing the process liquid pressure-fed from the process liquid supply source by the pressing apparatus and delivering the process liquid from an outlet; a riser piping through which the process liquid pressure-fed from the process liquid supply source is fed to the respective pumps; a plurality of nozzles each having a discharge port discharging the process liquid into the corresponding processing module; and a plurality of delivery pipings each connecting the outlet of the pump with the discharge port of the corresponding nozzle, the delivery pipings having identical length to each other.

According to the substrate processing system, since the delivery pipings connecting the outlets of the respective pumps with the discharge ports of the corresponding nozzles have identical length to each other, discharge pressures of the process liquid from the respective nozzles can be made uniform. Namely, the discharge conditions of the process liquid can be made uniform for each of the processing modules. As a result, it can be prevented that process results (for example, film-thickness profiles of the resist) of substrates processed by the process liquid differ for each of the processing modules. Further, since process conditions (e.g., control parameters of the pumps) set for the respective processing modules are the same, it is easy to take measures against a trouble in process results, when it occurs.

Preferably, the dispensing mechanism further includes: an upstream-side valve disposed between the process liquid supply source and the riser piping; a plurality of inlet-side valves disposed on inlet-sides of the respective pumps in the riser piping; a plurality of outlet-side valves disposed on the respective delivery pipings; and a controller that controls opening and closing operations of the upstream-side valve, the respective inlet-side valves, and the respective outlet-side valves.

Due to this structure, by controlling the valves in the dispensing mechanism, it is possible to fill the riser piping with the process liquid and to pressure-feed the process liquid to the respective pumps. Further it is possible to discharge the process liquid which is temporarily stored in the respective pumps.

Preferably, a flow channel is formed from each of the inlet-side valves to the corresponding outlet-side valve through which channel the process liquid flows only upward.

Due to this structure, when bubbles are generated in the process liquid running in the flow channel, it is possible to move the bubbles upward in the flow channel so as to let them out to the outside air. In addition, it is possible to prevent the process liquid from stagnating in the flow channel.

Preferably, the respective pumps are placed at levels equal to or higher than the process liquid supply source, and the respective nozzles are placed at levels higher than the corresponding pumps. In this case, for example, the plurality of pumps are vertically arranged at substantially the same intervals as those of the processing modules, and the uppermost pump is positioned to be adjacent to the second uppermost processing module in substantially a horizontal direction.

Due to this structure, when bubbles are generated in the process liquid running in a flow channel between the process liquid supply source and the respective nozzles, it is possible to move the bubbles upward in the flow channel so as to let them out to the outside air.

In the substrate processing system as structured above, it is preferable that the system comprise a plurality of dispensing mechanisms that supply process liquids of different types to the respective processing modules (M1, M2, . . . , M5), wherein each of the dispensing mechanisms includes: the pumps corresponding to the respective processing modules (M1, M2, . . . , M5); the nozzles corresponding to the respective processing modules (M1, M2, . . . , M5); (the inlet-side valves corresponding to the respective processing modules (M1, M2, . . . , M5); the outlet-side valves corresponding to the respective processing modules (M1, M2, . . . , M5);) the delivery pipings corresponding to the respective processing modules (M1, M2, . . . , M5); the process liquid supply source; the pressing apparatus; (the upstream-side valve; the controller;) and the riser piping, and wherein in each of the dispensing mechanisms; sub-dispensing units (DU11, DU12, . . . DU 17; DU21, DU 22, . . . , DU 27; and DU51, DU52, . . . , DU57) each having a unitary structure formed by connecting the vertically arranged inlet-side valve, the pump, and the outlet-side valve, are formed correspondingly to the processing modules (M1, M2, . . . , M5); and dispensing units (DU1, DU2, . . . , DU5) each having a unitary structure by connecting the horizontally arranged sub-dispensing units, are formed correspondingly to the processing modules (M1, M2, . . . , M5).

From the other standpoint, the present invention provides: a method of controlling a substrate processing system, the system including: a plurality of vertically arranged processing modules each processing a substrate with a process liquid; and a dispensing mechanism that dispenses the process liquid to the processing modules; wherein the dispensing mechanism includes: a process liquid supply source that contains the process liquid; a pressing apparatus that pressurizes the process liquid supply source to pressure-feed the process liquid; a plurality of pumps corresponding to the respective processing modules, each temporarily storing the process liquid pressure-fed from the process liquid supply source by the pressing apparatus and delivering the process liquid from an outlet; a riser piping through which the process liquid pressure-fed from the process liquid supply source is fed to the respective pumps; a plurality of nozzles each having a discharge port discharging the process liquid into the corresponding processing module; and a plurality of delivery pipings each connecting the outlet of the pump with the discharge port of the corresponding nozzle, the delivery pipings having identical length to each other; an upstream-side valve disposed between the process liquid supply source and the riser piping; a plurality of inlet-side valves disposed on inlet-sides of the respective pumps in the riser piping; and a plurality of outlet-side valves disposed on the respective delivery pipings, wherein the system is controlled to stabilize a pressure in the riser piping by executing the steps of: closing the respective inlet-side valves; and pressure-feeding the process liquid from the process liquid supply source by the pressing apparatus to fill the riser piping with the process liquid.

According to the controlling method, it is possible to feed the process liquid from the riser piping to the respective pumps at the same pressure.

In the controlling method, it is preferable that after the pressure in the riser piping is stabilized, the system be controlled to feed the process liquid into the respective pumps by a positive pressure in the riser piping to store the process liquid in the pumps, by further executing the steps of: closing the respective outlet-side valves; and opening the respective inlet-side valves.

Since the process liquid is fed into the respective pumps by a positive pressure, a negative pressure can be prevented from generating in the riser piping. Thus, in the process liquid, it is possible to prevent that nitrogen or the like forms micro bubbles because of the negative pressure.

In the controlling method, for example, after the process liquid is fed into the respective pumps to be temporarily stored therein, the system is controlled to discharge the process liquid from the discharge ports of the respective nozzles, by further executing the step of: delivering the process liquid from the respective pumps in conjunction with opening of the corresponding outlet-side valves.

In the controlling method, it is preferable that after the process liquid is discharged from the respective nozzles, the system be controlled to accumulate a pressure in the riser piping, by executing the steps of: closing the respective inlet-side valves; and closing the upstream-side valve.

Due to these steps, when the process liquid is newly supplied into the respective pumps, the process liquid can be immediately introduced into the pumps and stored therein. Moreover, time periods required for supplying the process liquid into the respective pumps can be made equal.

BRIEF DESCRIPTION OF THE DRAWINGS

FIG. 7 is a chart showing steps for controlling valves in the dispensing mechanism shown in FIG. 3.

DETAILED DESCRIPTION OF THE INVENTION

A substrate processing system according to the present invention and a method of controlling the same will be described below, with reference to the accompanying drawings.

Figure 1:
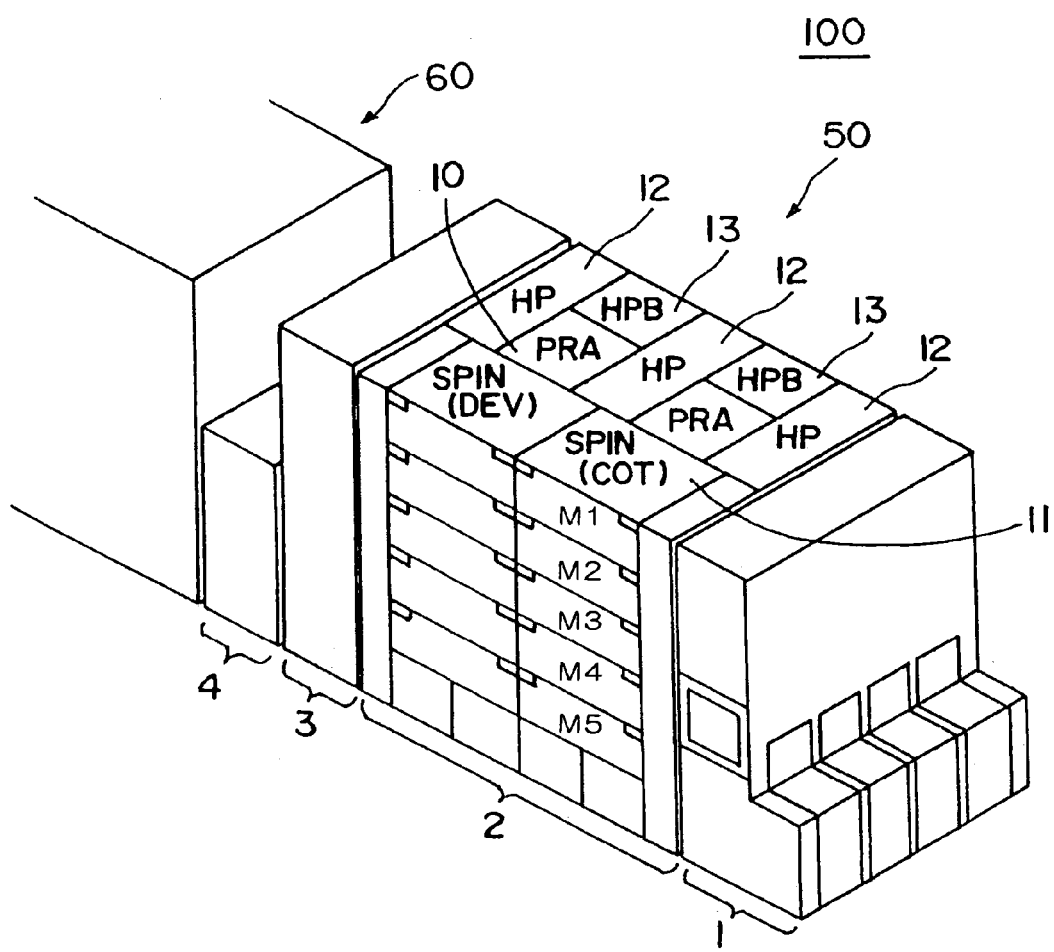
FIG. 1 is a perspective view of a pattern forming apparatus including an embodiment of a substrate processing system according to the present invention.
Figure 2:
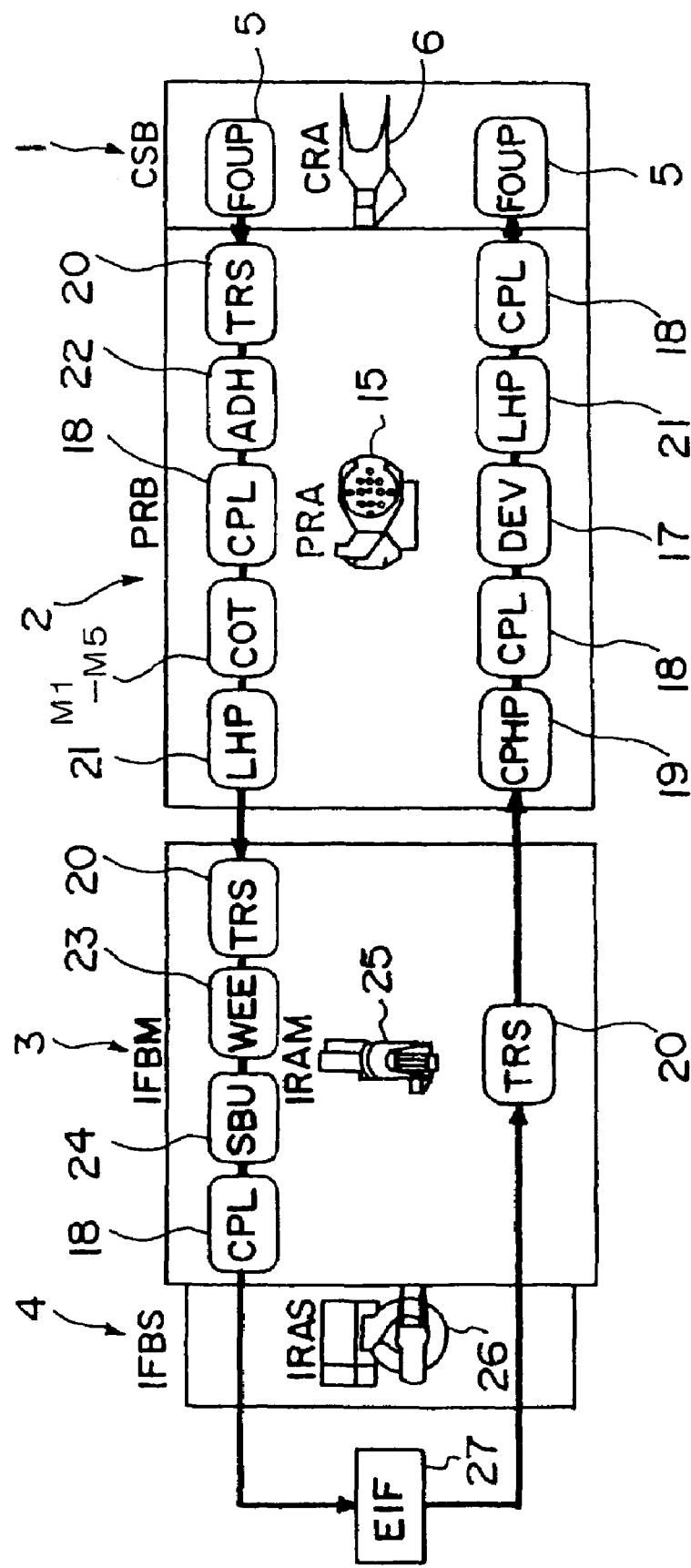
FIG. 2 is a block diagram schematically showing a process flow of the pattern forming apparatus shown in FIG. 1.

A pattern forming apparatus 100 shown in FIG. 1 includes a resist applying and developing apparatus 50 to which the substrate processing system according to the present invention is applied, and an aligner 60 that cooperates with the resist applying and developing apparatus 50 to perform an in-line process. As shown in FIGS. 1 and 2, the resist applying and developing apparatus 50 is composed of four blocks, i.e., a carrier station block (CSB) 1, a process block (PRB) 2, an interface block main (IFBM) 3, and an interface block sub (IFBS) 4.

The carrier station block (CSB) 1 is a block for loading and unloading a plurality of carrier cassettes (FOUP) 5 in which a plurality of wafers are hermetically contained. The carrier station block (CSB) 1 is provided with a carrier station conveying arm (CRA) 6 (FIG. 2) for loading and unloading the carrier cassettes (FOUP) 5. The process block (PRB) 2 is composed of four kinds of towers for performing different processes, i.e., a PRA tower 10, a SPIN tower 11, a connection oven (HP) tower 12, and a rear oven (HPB) tower 13. Each of the towers has vertically arranged apparatuses called "modules" for processing a wafer.

As shown in FIG. 2, the PRA tower 10 is provided with a process block conveying arm (PRA) 15. The conveying arm 15 is capable of vertically moving and rotating about a vertical axis, so that a wafer can be conveyed between the PRA tower 10 and other towers adjacent thereto.

In the SPIN tower 11, there are vertically arranged five coating process stations (COT) M1 to M5 that are processing modules for performing a resist application process to a wafer, and five developing process stations (DEV) 17 for performing a developing process, respectively.

In the connection oven (HP) tower 12, there are vertically arranged a chill plate process station (CPL) 18, a chilling high-accurate hot plate process station (CPHP) 19, and a transition stage (TRS) 20 as a stage to be used for conveying a wafer. In the rear oven (HPB) tower 13, there are vertically arranged a low-temperature hot plate process station (LHP) 21 for performing a thermal process of a low temperature, and an adhesion process station (ADH) 22 for performing a hydrophobizing process.

In the interface block main (IFBM) 3, there are vertically arranged a peripheral exposure process station (WEE) 23 that exposes only a peripheral part of a wafer, a stationary buffering stage (SBU) 24, and so on. As shown in FIG. 2, the IFBM 3 is provided with an interface block conveying arm main (IRAM) 25 capable of vertically moving and rotating about a vertical axis. Due to the provision of IRAM 25, wafers can be conveyed between the IFBM 3 and modules adjacent thereto.

As shown in FIG. 2, the interface block sub (IFBS) 4 is provided with an interface block conveying arm sub (IRAS) 26. Due to the provision of the IRAS 26, wafers can be unloaded from the applying and developing apparatus 50 and conveyed to the below-described aligner interface (EIF) 27 of the aligner 60.

The aligner 60 irradiates laser beams to a wafer on which a resist has been applied, through a reticle with a circuit pattern formed thereon, so as to expose the wafer. The aligner 60 is provided with the aligner interface (EIF) 27 serving as means for conveying a wafer. The wafers unloaded from the resist applying and developing apparatus 50 can be loaded into the aligner 60 via the EIF 27.

Next, a series of process steps performed by the pattern forming apparatus 100 as structured above are described with reference to FIG. 2.

At first, the carrier cassettes (FOUP) 5 containing unprocessed wafers are loaded into the carrier station block (CSB) 1. One of the wafers is conveyed from the FOUP 5 by the carrier station conveying arm (CRA) 6 to the transition stage (TRS) 20. After a position of the wafer is adjusted on the transition stage 20, the wafer is conveyed by the conveying arm (PRA) 15 to the adhesion process station (ADH) 22 in which the wafer is subjected to a hydrophobizing process. Then, the wafer is subjected to a predetermined cooling process in the chill plate process station (CPL) 18. Subsequently, the wafer is conveyed to the processing modules (COT) M1 to M5 in which a resist is applied to a surface of the wafer.

Following thereto, the wafer is subjected to a pre-baking process in the low-temperature hot plate process station (LHP) 21, and is conveyed to the transition stage (TRS) 20 in the interface block main (IFBM) 3. Then, the wafer is conveyed by the conveying arm main (IRAM) 25 to the peripheral exposure process station (WEE) 23 in which a peripheral part of the wafer is exposed. Thereafter, the wafer is temporarily placed on the stationary buffering stage (SBU) 24.

The exposed wafer is again conveyed to the TRS 20 in the IFBM 3 via the IFBS 4. Then, the wafer is subjected to a post-exposure baking (PEB) process in the hot plate process station (CPHP) 19, and is subjected to a cooling process in the CPL 18.

Thereafter, the wafer is conveyed to the develop process station (DEV) 17 in which the wafer is developed. The developed wafer is subjected, in the LHP 21, to a heating process for drying the resist to enhance an adhesion thereof to the wafer, that is, a post-baking process. After that, the wafer is cooled in the CPL 18, and is then returned to the FOUP 5.

Next, there is described the dispensing mechanism for dispensing a resist (process liquid) to the five processing modules (COT) M1 to M5 that are vertically arranged in the resist applying and developing apparatus 50.

Figure 3:
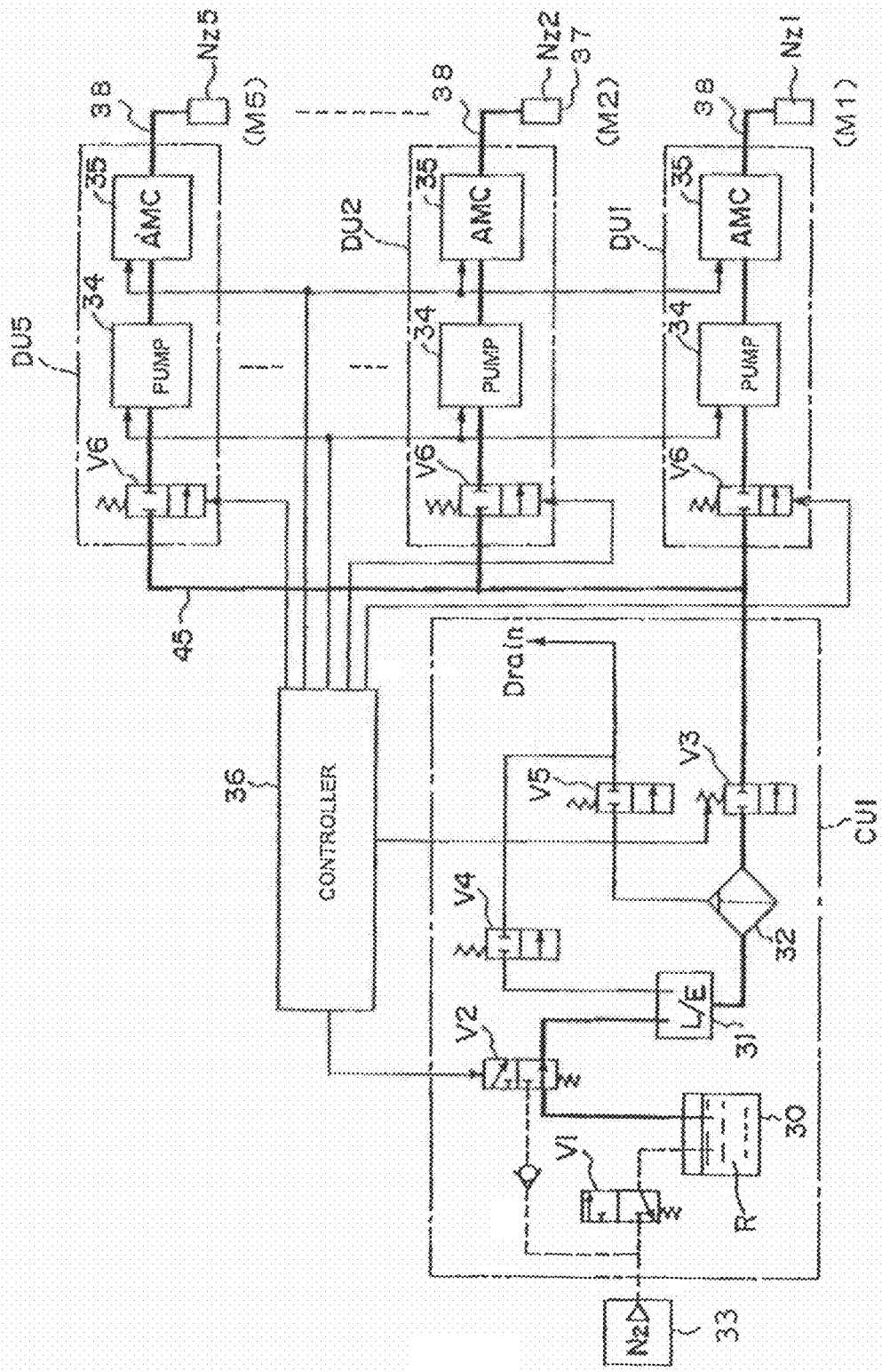
FIG. 3 is a block diagram schematically showing a dispensing mechanism in the substrate processing system shown in FIG. 1.

FIG. 3 shows a structure of one of seven dispensing mechanisms that dispense seven kinds of resists to the processing modules M1 to M5, respectively. Roughly, the mechanism shown in FIG. 3 is composed of a chemical unit CU 1 including a process liquid supply source, five dispensing units DU1 to DU5, a pressing apparatus 33, and a controller 36 that controls the unit CU 1, the units DU1 to DU5, and the pressing apparatus 33.

The chemical unit CU 1 includes a bottle (tank) 30 as a process liquid supply source containing a resist R, a liquid end 31, a filter 32, and a plurality of valves V1 to V5 whose opening and closing operations are controlled by the controller 36. The liquid end 31 is provided with detecting means that temporarily stores the resist R and buffers the same so as to detect whether the resist R remains in the bottle 30. A function of the filter 32 is to filter the resist R supplied from the bottle 30. The pressing apparatus 33 pressure-feeds the resist R by supplying nitrogen ($N_2$) into the bottle 30 of the chemical unit CU 1 to apply a pressure thereto.

The valve V1 is disposed between the pressing apparatus 33 and the bottle 30, and the valve V2 is disposed between the bottle 30 and the liquid end 31. The upstream-side valve V3 is disposed between a riser piping 45 through which the resist R is supplied to the respective dispensing units DU1 to DU5 and the filter 32 (downstream of the bottle 30). That is to say, the upstream-side valve V3 is disposed upstream of the riser piping 45.

The valve V4 is disposed on a drain (discharge) piping extending from the liquid end 31, and the valve V5 is disposed on a drain piping extending from the filter 32. When a gas (such as nitrogen) dissolved in the resist foams up in the liquid end 31 and the filter 32, these valves V4 and V5 discharge the generated bubbles.

In the chemical unit CU 1, when the valve V1 is opened and nitrogen is supplied into the bottle 30 by the pressing apparatus 33, a pressure in the bottle 30 is increased. When the inside of the bottle 30 is pressurized, the resist R is pressure-fed from the inside of the bottle 30 to open the valve V2, so that the resist R is supplied into the liquid end 31. The resist R supplied into the liquid end 31 is filtered by the filter 32. By opening the upstream-side valve V3, the filtered resist R is pressure-fed to the riser piping 45.

The dispensing units DU1 to DU5 respectively correspond to the processing modules (COT) M1 to M5 that are vertically arranged. Each of the dispensing units DU1 to DU5 includes a constant pressure pump 34, an inlet-side valve V6, and a dispensing valve (AMC) 35 as an outlet-side valve. Each of the inlet-side valves 6 is disposed on an inlet-side of the corresponding pump 34 in the riser piping 45. Supply of the resist to the pumps 34 is controlled by the controller 36 which controls opening and closing operations of the corresponding inlet-side valves 6. The respective dispensing valves 35 are disposed on delivery pipings 38 that connect outlets of the respective constant pressure pumps 34 with corresponding discharge ports 37 of respective nozzles Nz1 to Nz5. Discharge of the resist from the nozzles Nz1 to Nz5 are respectively controlled by the controller 36 which controls opening and closing operations of the corresponding dispensing valves 35.

Each of the dispensing units DU1 to DU5 is configured such that, when the inlet-side valve V6 is opened, the resist R is introduced into a storing part in the constant pressure pump 34 and stored therein by a positive pressure from the riser piping 45. Namely, the constant pressure pump 34 does not suck the resist to store the same, unlike the conventional pump which would generate a negative pressure in the riser piping 45 by the sucking motion. Therefore, since no negative pressure is generated in the riser piping 45, the nitrogen is prevented from foaming up in the resist.

The constant pressure pump 34 is configured to deliver the resist stored in the storing part from the outlet, by pressing the storing part with pressure-feeding means such as a diaphragm, not shown, which is controlled by the controller 36. When the resist is discharged from the nozzles Nz1 to Nz5 into the respective processing modules M1 to M5, the dispensing valves 35 are opened with the inlet-side valves 6 being closed.

Figure 4:
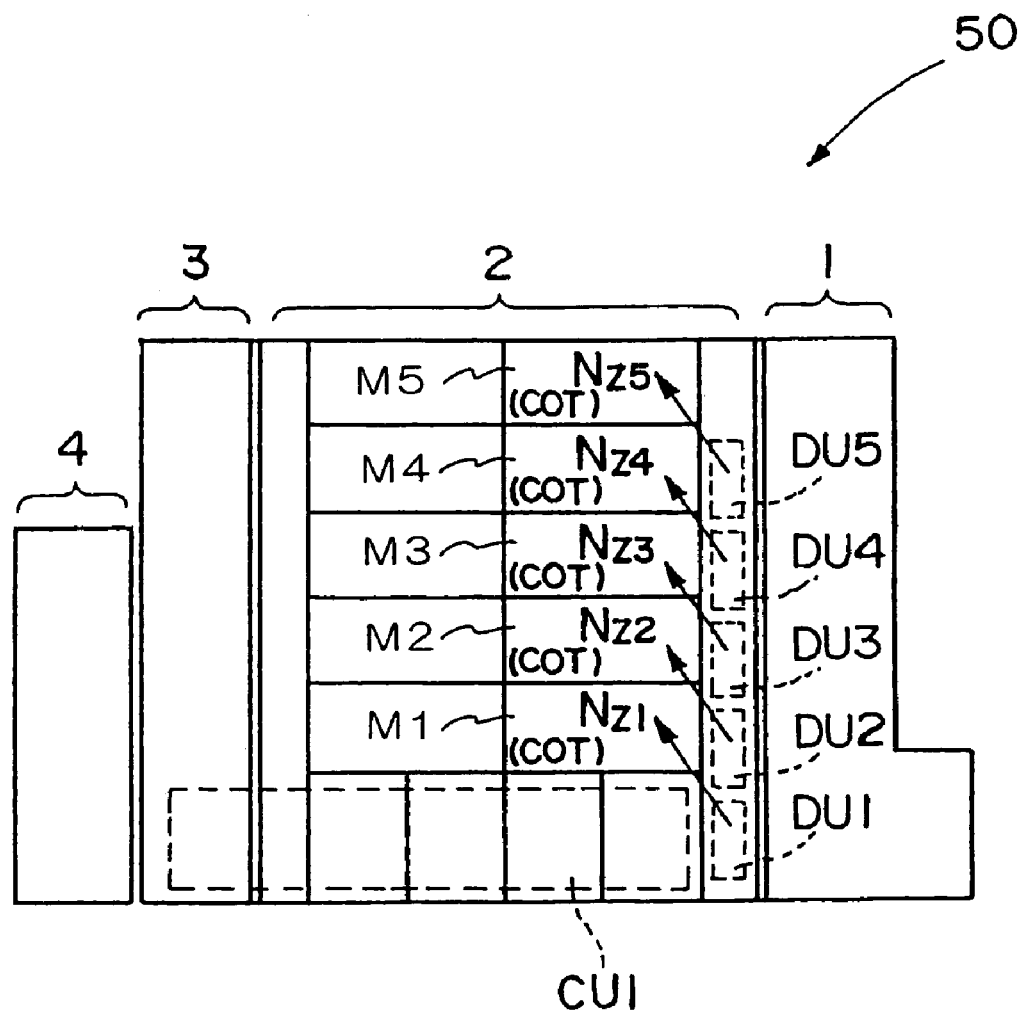
FIG. 4 is a front view showing an arrangement of the dispensing mechanism in the substrate processing system shown in FIG. 1.

The dispensing units DU1 to DU5 as structured above are placed near the corresponding processing modules (COT) M1 to M5. In this case, as shown in FIG. 4, the dispensing units DU1 to DU5 including the pumps are vertically arranged at substantially the same intervals as those of the processing modules (COT) M1 to M5, and the uppermost dispensing unit (pump) DU5 is positioned to be adjacent to the second uppermost processing module M4 in substantially the horizontal direction. Accordingly, the second, third, and fourth dispensing units (pumps) DU4, DU3, and DU2 from above are arranged to be adjacent to the third, fourth, and fifth processing modules M3, M2, and M1, from above, in substantially the horizontal direction.

Based on such an arrangement, lengths of the respective delivery pipings 38 connecting the outlets of the constant pressure pumps 34 in the respective units DU 1 to DU5 with the discharge ports 37 of the corresponding nozzles Nz1 to Nz5 are made equal to each other.

As shown in FIG. 4, the chemical unit CU1 is placed near a bottom of the resist applying and developing apparatus 50 (horizontally adjacent to the lowermost dispensing unit DU1). Thus, the respective dispensing units (pumps) DU1 to DU5 are placed at levels equal to or higher than the chemical unit (process liquid supply source) CU1. In addition, the respective nozzles Nz1 to Nz5 are placed at levels higher than the corresponding dispensing units (pumps) DU1 to DU5.

Figure 5:
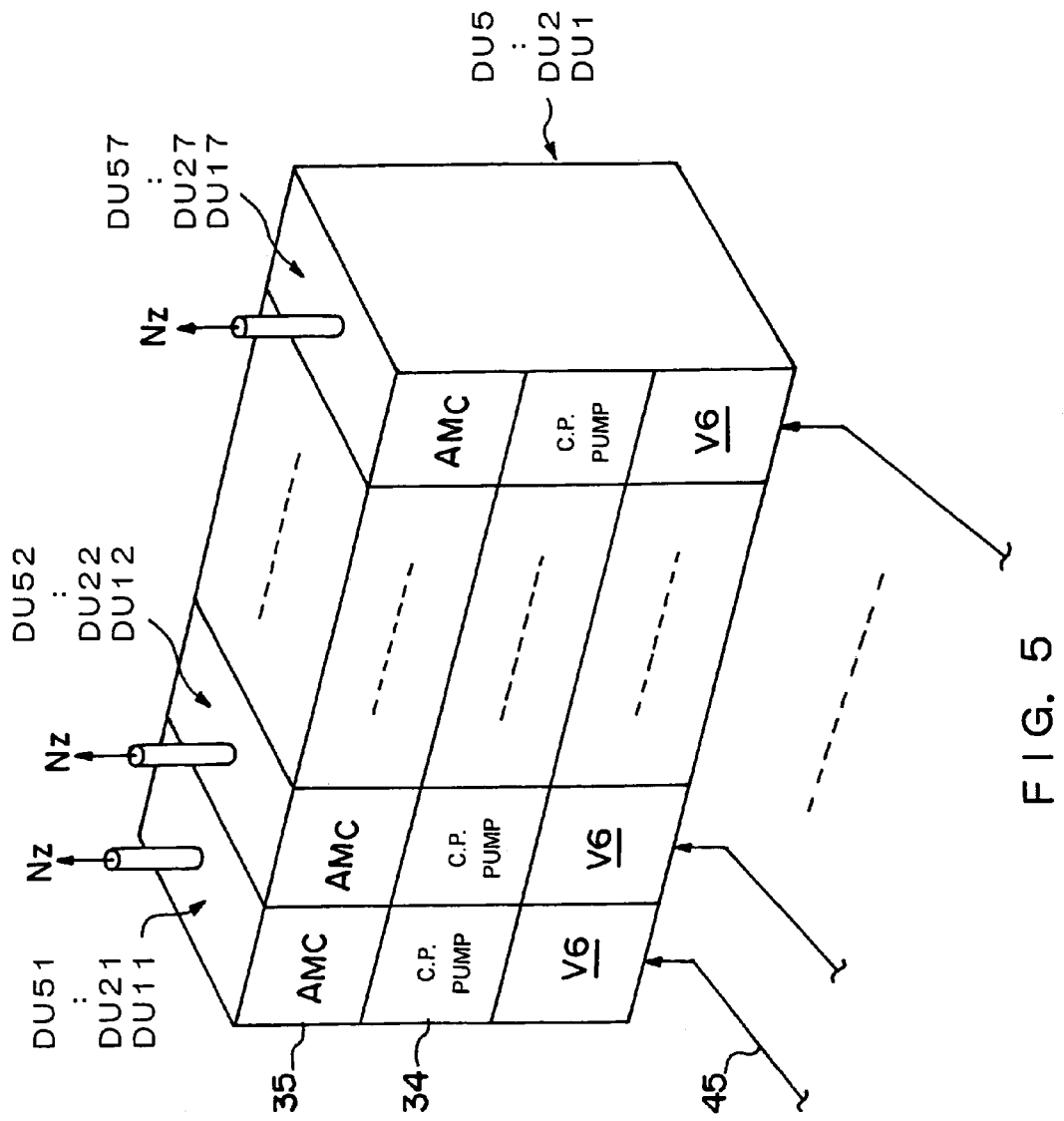
FIG. 5 is a perspective view of an arrangement of a sub-dispensing unit in each dispensing unit.

As shown in FIG. 5, as to the seven dispensing mechanisms, there are formed sub-dispensing units DU11, DU12, ... DU 17; DU21, DU 22, ..., DU 27; and DU51, DU52, ..., DU57, correspondingly to the processing modules M1, M2, ..., M5 (FIG. 4). Each of the sub-dispensing units has a unitary structure formed by connecting the vertically arranged inlet-side valve V6, the pump 34, and the AMC (outlet-side valve) 35. There are formed the dispensing units DU1, DU2, ..., DU5, correspondingly to the processing modules M1, M2, ..., M5 (FIG. 4). Each of the dispensing units has a unitary structure formed by connecting the horizontally arranged sub-dispensing units DU11, DU12, ... DU 17; DU21, DU 22, ..., DU 27; and DU51, DU52, ..., DU57.

It is preferred that the inlet-side valve V6, the constant pressure pump 34, and the dispensing valve (AMC) 35, that are vertically arranged in this order from below, be located at a position lower than the corresponding nozzle Nz. Provided that this condition is satisfied, the dispensing valves 35 may be disposed in the respective processing modules M1, M2, ..., M5 (FIG. 4), for example.

Owing to the arrangement of the dispensing mechanism as described above, a flow channel is formed from the tank 30 as a process liquid supply source to the respective nozzles Nz through which the resist as a process liquid flows only upward. As a result, when bubbles of nitrogen or the like are generated in the liquid passing through the resist flow channel, it is possible to move the bubbles upward in the flow channel so as to let them out to the outside air. In addition, it is possible to prevent the resist from stagnating in the flow channel.

Figure 6A:
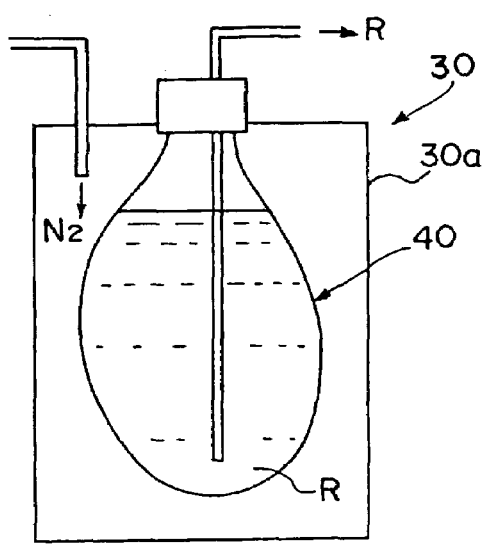
FIG. 6A is a longitudinal sectional view showing an example of a process liquid supplying source in the dispensing mechanism shown in FIG. 3.
Figure 6B:
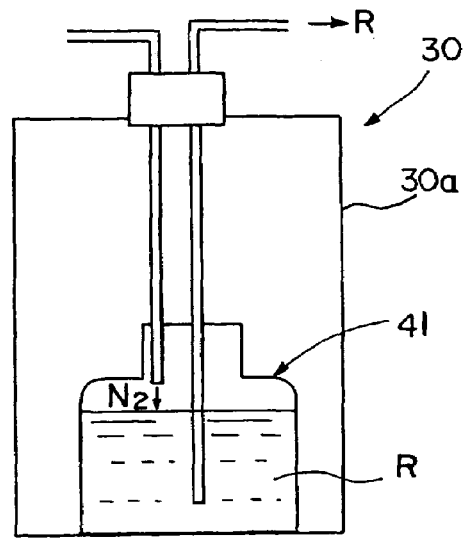
FIG. 6B is a longitudinal sectional view showing another example of the process liquid supplying source in the dispensing mechanism shown in FIG. 3.

Preferably, the bottle (tank) 30 as a processing liquid source in the dispensing mechanism is of a structure shown in FIG. 6A or 6B.

FIG. 6A shows a structure in which a pouch 40 containing the resist R is received in an outer container 30a. Nitrogen ($N_2$) from the pressing apparatus is supplied into a space between the outer container 30a and the pouch 40. In this structure, when nitrogen is supplied into the space to elevate a pressure in the outer container 30a, the pouch 40 is compressed so that the resist R contained therein is extruded outside. According to this structure, since nitrogen and the resist R do not contact each other, additional nitrogen does not come to be mixed in the resist R. In other words, it can be prevented that the nitrogen dissolved in the resist R foams up because of the negative pressure.

FIG. 6B shows a structure in which an inner container 41 containing the resist R is received in the outer container 30a. An upper part of the inner container 41 is opened, and the pressure inside the inner container 41 is the same as an outside pressure (pressure inside the outer container 30a). Nitrogen ($N_2$) is supplied from the pressing apparatus into a space in the inner container 41.

In this structure, when the pressures in the outer container 30a and the inner container 41 are elevated, the resist R contained in the inner container 41 is pressurized and extruded outside. According to this structure, since the pressure in the inner container 41 containing the resist R is the same as the outside pressure (pressure inside the outer container 30*a*), risks, such as an expansion of the container, which is caused by the increase in pressure can be avoided.

Next, control operations for discharging the resist from the nozzles in the dispensing mechanism as structured above are described with reference to the chart of FIG. 7. Herein, how the discharge of the resist is controlled by an operation of the pressure-feeding means in the constant pressure pump 34 is also described. That is, FIG. 7 shows, in the order of the processing steps, on/off (opening/closing) operations of the valve V2, the upstream-side valve V3, the inlet-side valves V6, and the dispensing valves (AMC) 35, that are controlled by the controller 36, and on/off (stop/delivery) operations of the pressure-feeding means in the constant pressure pumps.

As shown in FIG. 7, when the resist R is discharged from the respective nozzles Nz1 to Nz5, the resist is introduced into and stored in the constant pressure pumps (steps S1 to S6). Then, the resist is discharged from the nozzles (steps S7 and S8).

The steps are sequentially described in detail. At first, nitrogen is fed into the tank 30 by the pressing apparatus 33 to pressurize the inside of the tank (step S1). At this step, only the outlet-side valve V2 of the tank 30 is opened, while other valves are kept closed. Under this state, a pressure is applied to a part upstream of an outlet of the filter 32.

Then, the upstream-side valve V3 opened, and the riser piping 45 is filled with the resist R which has been pressingly extruded from the tank 30. Thus, a pressure in the riser piping 45 is stabilized (step S2). Up to this moment, the inlet-side valves V6 in the respective dispensing unit DU1 to DU5 are fully closed.

The inlet-side valves V6 in the respective dispensing units DU1 to DU5 are sequentially opened in sync with the discharge timings. At this time, due to the positive pressure from the riser piping 45, the resist R flows into the constant pressure pumps 34 and is stored therein (step S3).

After the resist R is drawn into and stored in the constant pressure pumps 34, the inlet-side valves V6 are closed at first (step S4). Up to this moment, the resist is not delivered from the constant pressure pumps 34, but is received in the storing parts of the constant pressure pumps 34.

After the inlet-side valves V6 are closed, the upstream-side valve V3 is closed (step S5). Under this state, since the riser piping 45 is filled with the resist R, a pressure-accumulated state in the riser piping 45 is maintained. Since the riser piping 45 is kept pressurized, the resist can be immediately introduced into the constant pressure pumps 34 and stored therein, when the resist is newly supplied thereinto. Moreover, time periods required for supplying the resist into the pumps 34 of the respective units DU1 to DU5 can be made equal.

At the step S5, the upstream-side valve V3 is closed to stop the application of pressure to the tank 30, and the valve V2 is closed, so that the resist storing operation in the constant pressure pumps 34 is completed (step S6).

Thereafter, at the discharging step, the inlet-side valves V6 are closed, and the resist stored in the constant pressure pumps 34 is delivered by the pressure-feeding means. At substantially the same time of the delivery of the resist from the pumps 34, the dispensing valves (AMC) 35 are opened. However, it is a matter of course that the opening timing of the dispensing valves (AMC) 35 can be suitably varied.

Then, the resist is discharged from each nozzle Nz. By adjusting an opening period of the dispensing valve (AMC) 35, an amount of the resist to be discharged is controlled (steps S7). When the dispensing valve 35 is closed, discharge of the resist is stopped (step S8).

According to the embodiment, since the delivery pipings 38 connecting the outlets of the respective pumps 34 with the discharge ports 37 of the corresponding nozzles Nz1 to Nz5 have identical length to each other, discharge pressures of the resist from the respective nozzles Nz1 to Nz5 can be made uniform. Namely, the discharge conditions of the resist can be made uniform for each of the processing modules M1 to M5. As a result, it can be prevented that process results (for example, film-thickness profiles of the resist) of substrates processed by the resist differ for each of the processing modules M1 to M5. Further, since process conditions (e.g., control parameters of the pumps 34) set for the respective processing modules M1 to M5 are the same, it is easy to take measures against a trouble in process results, when it occurs.

The resist R is drawn into the constant pressure pump 34 not by a suction motion of the pump, but by a positive pressure from the riser piping 45 whose pressure has been stabilized. During the introduction operation of the resist R into the constant pressure pump 34, the resist R is continuously supplied into the riser piping 45 from the bottle 30. Thus, there is no possibility that a negative pressure is generated in the riser piping 45. Accordingly, generation of bubbles of a gas, such as nitrogen, in the resist can be prevented.

In this embodiment, the dispensing mechanism is applied as a processing module as a coat process station (COT) that applies a resist to a substrate. However, not limited to the COT, the dispensing mechanism of the substrate processing system according to the present invention can be applied to other processing modules that process substrates with the use of a process liquid.

In this embodiment, although a semiconductor wafer is used as a substrate to be processed, the present invention is not limited thereto. For example, the substrate in the present invention may be an LCD substrate, a CD substrate, a glass substrate, a photo-mask, and a print substrate.

The invention claimed is:

1. A substrate processing system comprising:
    a plurality of vertically arranged processing modules each processing a substrate with a process liquid; and
    a dispensing mechanism that dispenses the process liquid to the processing modules;
    wherein the dispensing mechanism includes:
        a process liquid supply source that contains the process liquid;
        a pressing apparatus that pressurizes the process liquid supply source to pressure-feed the process liquid;
        a plurality of pumps corresponding to the respective processing modules, each temporarily storing the process liquid pressure-fed from the process liquid supply source by the pressing apparatus and delivering the process liquid from an outlet;
        a riser piping through which the process liquid pressure-fed from the process liquid supply source is fed to the respective pumps;
        a plurality of nozzles each having a discharge port discharging the process liquid into the corresponding processing module; and
        a plurality of delivery pipings each connecting the outlet of the pump with the discharge port of the corresponding nozzle, the delivery pipings having identical lengths to each other, wherein
    the dispensing mechanism further includes:
        an upstream-side valve disposed between the process liquid supply source and the riser piping;

a plurality of inlet-side valves disposed on inlet-sides of the respective pumps in the riser piping;

a plurality of outlet-side valves disposed on the respective delivery pipings; and a controller that controls opening and closing operations of the upstream-side valve, the respective inlet-side valves, and the respective outlet-side valves.

2. The system according to claim 1, wherein a flow channel is formed from each of the inlet-side valves to the corresponding outlet-side valve through which channel the process liquid flows only upward.

3. The system according to claim 2, wherein the respective pumps are placed at levels equal to or higher than the process liquid supply source, and the respective nozzles are placed at levels higher than the corresponding pumps.

4. The system according to claim 3, wherein the plurality of pumps are vertically arranged at substantially the same intervals as those of the processing modules, and the uppermost pump is positioned to be adjacent to the second uppermost processing module in substantially a horizontal direction.

5. The system according to claim 4, comprising a plurality of dispensing mechanisms that supply process liquids of different types to the respective processing modules (M1, M2, ..., M5), wherein each of the dispensing mechanisms includes:

the pumps corresponding to the respective processing modules (M1, M2, ..., M5);

the nozzles corresponding to the respective processing modules (M1, M2, ..., M5); the delivery pipings corresponding to the respective processing modules (M1, M2, ..., M5); the inlet-side valves corresponding to the respective processing modules (M1, M2, ..., M5); the outlet-side valves corresponding to the respective processing modules (M1, M2, ..., M5); the process liquid supply source; the pressing apparatus; the riser piping; the upstream-side valve; and the controller, and wherein in each of the dispensing mechanisms;

sub-dispensing units (Du11, DU12, DU 17; DU21, DU 22, ..., DU 27; and DU51, DU52, ..., DU57) each having a unitary structure formed by connecting the vertically arranged inlet-side valve, the pump, and the outlet-side valve, are formed correspondingly to the processing modules (M1, M2, ..., M5); and dispensing units (DU1, DU2, ..., DU5) each having a unitary structure by connecting the horizontally arranged sub-dispensing units, are formed correspondingly to the processing modules (M1, M2, ..., M5).

6. The system according to claim 2, comprising a plurality of dispensing mechanisms that supply process liquids of different types to the respective processing modules (M1, M2, ..., M5), wherein each of the dispensing mechanisms includes:

the pumps corresponding to the respective processing modules (M1, M2, ..., M5); the nozzles corresponding to the respective processing modules (M1, M2, ..., M5); the delivery pipings corresponding to the respective processing modules (M1, M2, ..., M5); the inlet-side valves corresponding to the respective processing modules (M1, M2, ..., M5); the outlet-side valves corresponding to the respective processing modules (M1, M2, ..., M5); the process liquid supply source; the pressing apparatus; the riser piping; the upstream-side valve; and the controller, and wherein in each of the dispensing mechanisms;

sub-dispensing units (DU11, DU12, ... DU 17; DU21, DU 22, ..., DU 27; and DU51, DU52, ..., DU57) each having a unitary structure formed by connecting the vertically arranged inlet-side valve, the pump, and the outlet-side valve, are formed correspondingly to the processing modules (M1, M2, ..., M5); and dispensing units (DU1, DU2, ..., DU5) each having a unitary structure by connecting the horizontally arranged sub-dispensing units, are formed correspondingly to the processing modules (M1, M2, ..., M5).

7. The system according to claim 1, wherein the respective pumps are placed at levels equal to or higher than the process liquid supply source, and the respective nozzles are placed at levels higher than the corresponding pumps.

8. The system according to claim 7, wherein the plurality of pumps are vertically arranged at substantially the same intervals as those of the processing modules, and the uppermost pump is positioned to be adjacent to the second uppermost processing module in substantially a horizontal direction.

9. The system according to claim 8, comprising a plurality of dispensing mechanisms that supply process liquids of different types to the respective processing modules (M1, M2, ..., M5), wherein each of the dispensing mechanisms includes:

the pumps corresponding to the respective processing modules (M1, M2, ..., M5); the nozzles corresponding to the respective processing modules (M1, M2, ..., M5); the delivery pipings corresponding to the respective processing modules (M1, M2, ..., M5); the inlet-side valves corresponding to the respective processing modules (M1, M2, ..., M5); the outlet-side valves corresponding to the respective processing modules (M1, M2, ..., M5); the process liquid supply source; the pressing apparatus; the riser piping; the upstream-side valve; and the controller, and wherein in each of the dispensing mechanisms;

sub-dispensing units (DU11, DU12, ... DU 17; DU21, DU 22, ..., DU 27; and DU51, DU52, ..., DU57) each having a unitary structure formed by connecting the vertically arranged inlet-side valve, the pump, and the outlet-side valve, are formed correspondingly to the processing modules (M1, M2, ..., M5); and dispensing units (DU1, DU2, ..., DU5) each having a unitary structure by connecting the horizontally arranged sub-dispensing units, are formed correspondingly to the processing modules (M1, M2, ..., M5).

10. The system according to claim 1, comprising a plurality of dispensing mechanisms that supply process liquids of different types to the respective processing modules (M1, M2, ..., M5), wherein each of the dispensing mechanisms includes:

the pumps corresponding to the respective processing modules (M1, M2, ..., M5); the nozzles corresponding to the respective processing modules (M1, M2, ..., M5); the delivery pipings corresponding to the respective processing modules (M1, M2, ..., M5); the inlet-side valves corresponding to the respective processing modules (M1, M2, ..., M5); the outlet-side valves corresponding to the respective processing modules (M1, M2, ..., M5); the process liquid supply source; the pressing apparatus; the riser piping; the upstream-side valve; and the controller, and wherein in each of the dispensing mechanisms;

sub-dispensing units (DU11, DU12, ... DU 17; DU21, DU 22, ..., DU 27; and DU51, DU52, ..., DU57) each having a unitary structure formed by connecting the vertically arranged inlet-side valve, the pump, and the outlet-side valve, are formed correspondingly to the processing modules (M1, M2, ..., M5); and dispensing units (DU1, DU2, ..., DU5) each having a unitary structure by connecting the horizontally arranged sub-dispensing units, are formed correspondingly to the processing modules (M1, M2, ..., M5).

11. The system according to claim 1, wherein the respective pumps are placed at levels equal to or higher than the process liquid supply source, and the respective nozzles are placed at levels higher than the corresponding pumps.

12. The system according to claim 11, wherein the plurality of pumps are vertically arranged at substantially the same intervals as those of the processing modules, and the uppermost pump is positioned to be adjacent to the second uppermost processing module in substantially a horizontal direction.

13. The system according to claim 12, comprising a plurality of dispensing mechanisms that supply process liquids of different types to the respective processing modules (M1, M2, ..., M5), wherein each of the dispensing mechanisms includes:

the pumps corresponding to the respective processing modules (M1, M2, ..., M5); the nozzles corresponding to the respective processing modules (M1, M2, ..., M5); the delivery pipings corresponding to the respective processing modules (M1, M2, ..., M5); the process liquid supply source; the pressing apparatus; the riser piping; a plurality of inlet-side valves disposed on inlet-sides of the respective pumps in the riser piping; and a plurality of outlet-side valves disposed on the respective delivery pipings, and wherein in each of the dispensing mechanisms;

sub-dispensing units (DU11, DU12, ... DU 17; DU21, DU 22, ..., DU 27; and DU51, DU52, ..., DU57) each having a unitary structure formed by connecting the vertically arranged inlet-side valve, the pump, and the outlet-side valve, are formed correspondingly to the processing modules (M1, M2, ..., M5); and dispensing units (DU1, DU2, ..., DU5) each having a unitary structure by connecting the horizontally arranged sub-dispensing units, are formed correspondingly to the processing modules (M1, M2, ..., M5).

14. The system according to claim 11, comprising a plurality of dispensing mechanisms that supply process liquids of different types to the respective processing modules (M1, M2, ..., M5), wherein each of the dispensing mechanisms includes:

the pumps corresponding to the respective processing modules (M1, M2, ..., M5); the nozzles corresponding to the respective processing modules (M1, M2, ..., M5); the delivery pipings corresponding to the respective processing modules (M1, M2, ..., M5); the process liquid supply source; the pressing apparatus; the riser piping; a plurality of inlet-side valves disposed on inlet-sides of the respective pumps in the riser piping; and a plurality of outlet-side valves disposed on the respective delivery pipings, and wherein in each of the dispensing mechanisms;

sub-dispensing units (DU11, DU12, ... DU 17; DU21, DU 22, ..., DU 27; and DU51, DU52, ..., DU57) each having a unitary structure formed by connecting the vertically arranged inlet-side valve, the pump, and the outlet-side valve, are formed correspondingly to the processing modules (M1, M2, ..., M5); and dispensing units (DU1, DU2, ..., DU5) each having a unitary structure by connecting the horizontally arranged sub-dispensing units, are formed correspondingly to the processing modules (M1, M2, ..., M5).

15. The system according to claim 1, comprising a plurality of dispensing mechanisms that supply process liquids of different types to the respective processing modules (M1, M2, ..., M5), wherein each of the dispensing mechanisms includes:

the pumps corresponding to the respective processing modules (M1, M2, ..., M5); the nozzles corresponding to the respective processing modules (M1, M2, ..., M5); the delivery pipings corresponding to the respective processing modules (M1, M2, ..., M5); the process liquid supply source; the pressing apparatus; the riser piping; a plurality of inlet-side valves disposed on inlet-sides of the respective pumps in the riser piping; and a plurality of outlet-side valves disposed on the respective delivery pipings, and wherein in each of the dispensing mechanisms;

sub-dispensing units (DU11, DU12, ... DU 17; DU21, DU 22, ..., DU 27; and DU51, DU52, ..., DU57) each having a unitary structure formed by connecting the vertically arranged inlet-side valve, the pump, and the outlet-side valve, are formed correspondingly to the processing modules (M1, M2, ..., M5); and dispensing units (DU1, DU2, ..., DU5) each having a unitary structure by connecting the horizontally arranged sub-dispensing units, are formed correspondingly to the processing modules (M1, M2, ..., M5).

* * * * *